United States Patent
Haga et al.

(10) Patent No.: US 7,498,203 B2
(45) Date of Patent: Mar. 3, 2009

(54) THERMALLY ENHANCED BGA PACKAGE WITH GROUND RING

(75) Inventors: Chris Haga, McKinney, TX (US); Leland Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 190 days.

(21) Appl. No.: 11/407,836

(22) Filed: Apr. 20, 2006

(65) Prior Publication Data
US 2007/0246823 A1 Oct. 25, 2007

(51) Int. Cl.
*H01L 21/44* (2006.01)
*H01L 21/48* (2006.01)
*H01L 21/50* (2006.01)

(52) U.S. Cl. .................. 438/122; 438/125
(58) Field of Classification Search .................. 257/706, 257/707, 712, 738, 778; 438/108, 122, 125
See application file for complete search history.

(56) References Cited

U.S. PATENT DOCUMENTS

| 6,740,959 | B2 * | 5/2004 | Alcoe et al. ............... 257/659 |
| 2001/0026955 | A1 | 10/2001 | Briar |
| 2002/0163064 | A1 | 11/2002 | Aquien et al. |
| 2002/0171144 | A1 | 11/2002 | Zhang et al. |
| 2006/0200985 | A1 * | 9/2006 | Workman et al. ............. 29/860 |

* cited by examiner

*Primary Examiner*—Thien F Tran
(74) *Attorney, Agent, or Firm*—Tum Thack; Wade J. Brady, III; Frederick J. Telecky, Jr.

(57) ABSTRACT

The invention provides thermally enhanced BGAs and methods for their fabrication with a ground ring suitable for operably coupling to either the frontside or backside, or both, of an IC chip mounted on a substrate. The methods and devices of the invention disclosed include the fabrication of a ground ring on the surface of a BGA substrate prepared for receiving the frontside of the chip. A heat spreader has ground ring corresponding to substrate round ring and is attached at the backside of the chip with a conductive material. A conductive material is interposed between the heat spreader and substrate ground rings, electrically coupling them. Thus, the backside of the chip may be electrically connected to the ground ring as well as, or instead of, the frontside.

9 Claims, 4 Drawing Sheets

THERMALLY ENHANCED BGA PACKAGE WITH GROUND RING

TECHNICAL FIELD

The invention relates to electronic semiconductor devices and manufacturing. More particularly, the invention relates to surface-mount BGA-packaged flip-chip semiconductor devices and to methods for the manufacture of the same.

BACKGROUND OF THE INVENTION

The ball grid array (BGA) is a well-known type of surface-mount package that utilizes an array of metallic bumps or nodules, often denominated "solder balls," as means for providing external electrical connections. The solder balls are attached to a laminated substrate at the bottom side of the package. The die, or integrated circuit (IC) chip of the BGA is commonly connected to the substrate by flip-chip connections. The term "flip-chip" refers to a semiconductor chip that can be mounted directly onto a substrate or PCB in a "face-down" orientation. Electrical connections are completed through conductive bumps built on the surface of the chip, thus the mounting process is frontside down. Because flip-chips do not require wirebonds, they can be made smaller than their conventional counterparts and can avoid performance problems related to inductance and capacitance associated with bond wires. The space between the flip-chip surface and the PCB or substrate is typically filled with a non-conductive adhesive underfill material to protect the contacts and the flip-chip surface from moisture, contaminants, and other hazards. The underfill material also mechanically locks the flip-chip surface to the board or substrate.

The layered substrate of a BGA has internal conductive paths that electrically connect the chip bonds to the ball array. Often, the BGA substrate is formed with a structure termed a "ground ring" on its surface, though it is most often rectangular. The ground ring is an electrically conductive trace, usually metal or alloy, arranged to encircle the chip and is used to connect the ground pads of the packaged chip to ground lines of the PCB. The ground ring is separated from the chip attachment site by a concentric non-conductive gap on the substrate surface.

An advantage of the flip-chip BGA is its high interconnection density, i.e., the number of balls per given package volume is high. All packages have drawbacks, however. The high density of the flip-chip BGA which makes it desirable for many applications can lead to a concentration of excess heat generated during operation of the circuitry. In general, the semiconductor chip generates heat when operated and cools when inactive. Due to the changes in temperature, the package as a whole tends to thermally expand and contract. However, since in many cases the thermal expansion behavior of the packaged device, its internal components, and PCB differ, stresses can occur at the connecting solder balls, within the PCB or chip, or at the junctions of the package components.

In general, the excess heat making its departure from a BGA package may be understood in terms of following three thermal paths. A fairly direct thermal path exists from the front surface of the chip though the underlying substrate, however heat transmission is impaired by the generally poor thermal properties of the substrate itself. This thermal path is sometimes improved by the addition of thermal vias or thermal BGA balls designed to increase heat conduction away from the chip and substrate respectively, but problems remain, particularly in the case of silicon on insulator (SOI) devices. SOI is a semiconductor wafer technology that produces higher-performance, lower-power devices than conventional CMOS techniques. SOI uses a thin insulating layer, such as silicon oxide or glass, between a thin layer of silicon and the silicon substrate. This process helps reduce the amount of electrical charge required to operate the chip, making it faster and more energy-efficient. Although SOI devices typically generate less heat than other types of devices, ridding the SOI devices of excess heat is still a consideration, and the insulating layer is generally unhelpful in this regard. The differences between the coefficients of thermal expansion of the silicon and oxide, glass, or other insulating layer(s) can result in stresses within the silicon layer(s), which tend to diminish electrical performance. Additionally, stresses among and between the layers can cause mechanical separation leading to device failure.

Following a second thermal path, heat may also travel in the plane of the substrate. This can be a fairly good thermal path, particularly in packages with thick substrates, but is generally longer and in some instances may be insufficient to adequately dissipate heat generated by the IC. The third thermal path, from the backside of the chip to the outside of the package, is typically a relatively poor thermal path due to the inherent heat resistance of the surrounding encapsulant material, although heat conduction may sometimes be improved by the use of heat-conductive mold compound material, or the inclusion of a heat spreader or external heat sink. Current thermally enhanced flip-chip BGAs do not allow for electrical contact to the backside of the die. Contact to the backside of the die is important for SOI processes in order to facilitate AC operation and stability. Improvements to heat dissipation in BGA packages are necessarily limited by the geometry of the BGA and are not sufficient in all cases, leaving a need for further improvements in thermally enhanced BGA packages. Additionally, it is desirable to provide for electrical contact to the backside of the chip, particularly in SOI devices.

Due to these and other problems, it would be useful and advantageous to provide surface-mountable semiconductor packages such as flip-chip BGA packages with improved thermal conduction properties and/or improved back-side grounding, and to provide methods for manufacturing such packages.

SUMMARY OF THE INVENTION

In carrying out the principles of the present invention, in accordance with preferred embodiments thereof, packaged BGA devices are provided with improved thermal paths for removing excess heat from the chip.

According to one aspect of the invention, a BGA package of the invention includes an IC mounted on an insulator, Silicon On Insulator, (SOI) with its backside operably coupled to a ground ring.

According to another aspect of the invention, a BGA package includes a heat spreader and a chip encircled by an electrically continuous annulus of conductive material extending from a substrate ground ring to the heat spreader.

According to yet another aspect of the invention, a BGA package according to the invention includes a flip-chip IC mounted on an insulator (SOI) with its backside operably coupled to a ground ring.

The invention has advantages including but not limited to providing an improved thermal path for the egress of heat from a packaged semiconductor device. This and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

In general, the invention provides thermally enhanced BGAs and methods for their fabrication with a backside heat spreader and a ground ring suitable for operably coupling to either the frontside or backside, or both, of an IC chip, preferably a flip-chip. As further described below, the approach of the invention includes the fabrication of a ground ring on the surface of a BGA substrate prepared for receiving the frontside of a chip, and the attachment of a heat spreader with a corresponding ground ring at the backside of the chip. The chip is affixed to a mounting site on the substrate, and is underfilled with a non-conductive material. The heat spreader is attached to the backside of the chip with a conductive material such as epoxy or solder, and cured. A conductive material is injected between the heat spreader and substrate, electrically coupling the heat spreader and substrate ground rings. Thus, the backside of the chip may be electrically connected to ground in addition to, or instead of, the frontside. There are various alternatives possible in the implementation of the invention. For example, conductive epoxy used for heat spreader attachment may be applied to both the backside of the chip and the BGA substrate ground ring. After curing, the backside of the chip may be coupled to the BGA substrate ground contacts. The preferred embodiments of the invention are described by way of illustrative example, and are not exclusive of variations or combinations of steps in the methods disclosed, or of rearrangement of step order, so long as one or more stages of injection of non-conductive and conductive materials are used to operably couple ground rings on the substrate and heat spreader. In one preferred embodiment, the present invention facilitates the use of Silicon On Insulator (SOI) processes for implementing flip-chip BGAs in small thermally enhanced packages.

Figure 1A:
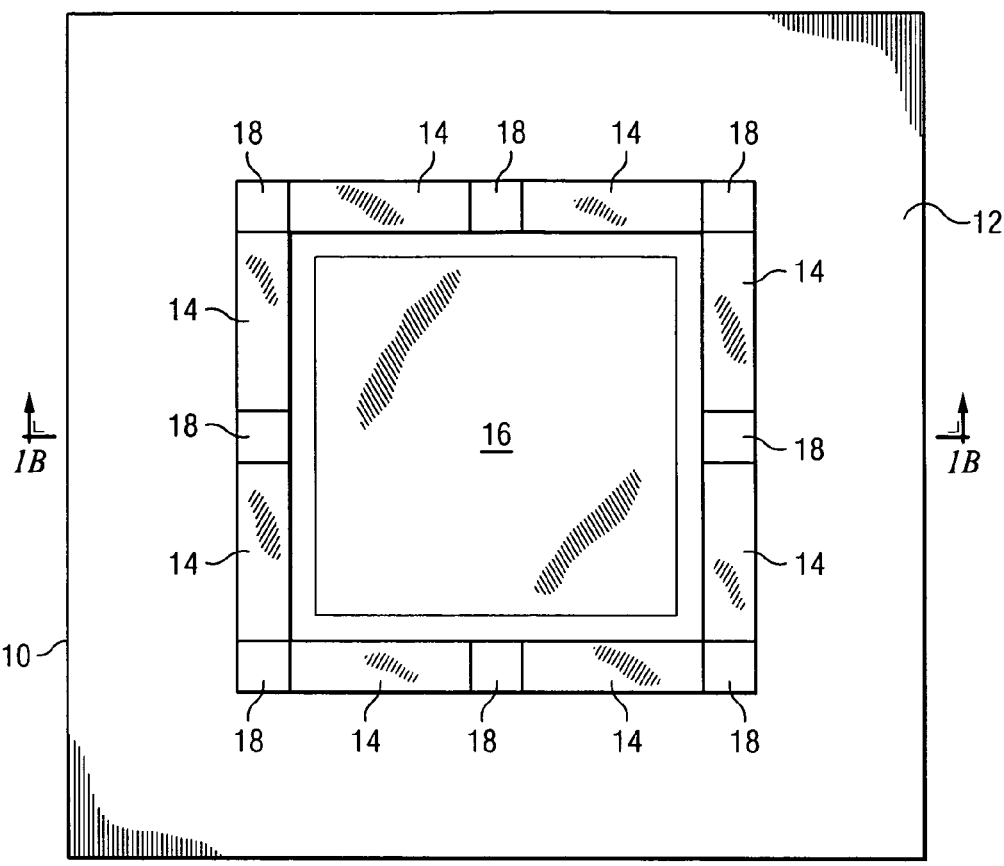
FIG. 1A is a top view showing an early step in an example of a method of manufacturing a device according to a preferred embodiment of the invention.
Figure 1B:
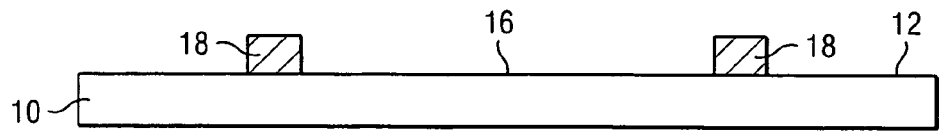
FIG. 1B is a cut-away side view corresponding to the top view of FIG. 1A, showing an early step in the method of manufacturing a device according to a preferred embodiment of the invention.

Now referring primarily to FIG. 1A, a top view, and FIG. 1B, a corresponding cut-away side view (taken along line 1B-1B of FIG. 1A), steps in the fabrication of a flip-chip BGA according to an example of a preferred embodiment of the invention are described. A semiconductor substrate 10, preferably including an upper surface layer 12 of insulative material, such as silicon oxide or glass suitable for implementing a SOI package structure, is provided with a ground ring 14 encircling a chip site 16 prepared to receive an IC chip as known in the arts. Vertical pillars 18 are preferably provided at each corner of the substrate ground ring 14. Additional pillars 18 may be provided at intervals along the sides of the substrate ground ring 14 as shown. The vertical pillars 18 are preferably made from conductive material such as metal or metal alloy, and extend above the substrate 10 according to the height of the chip to be installed in order to accommodate a heat spreader as further described.

Figure 2A:
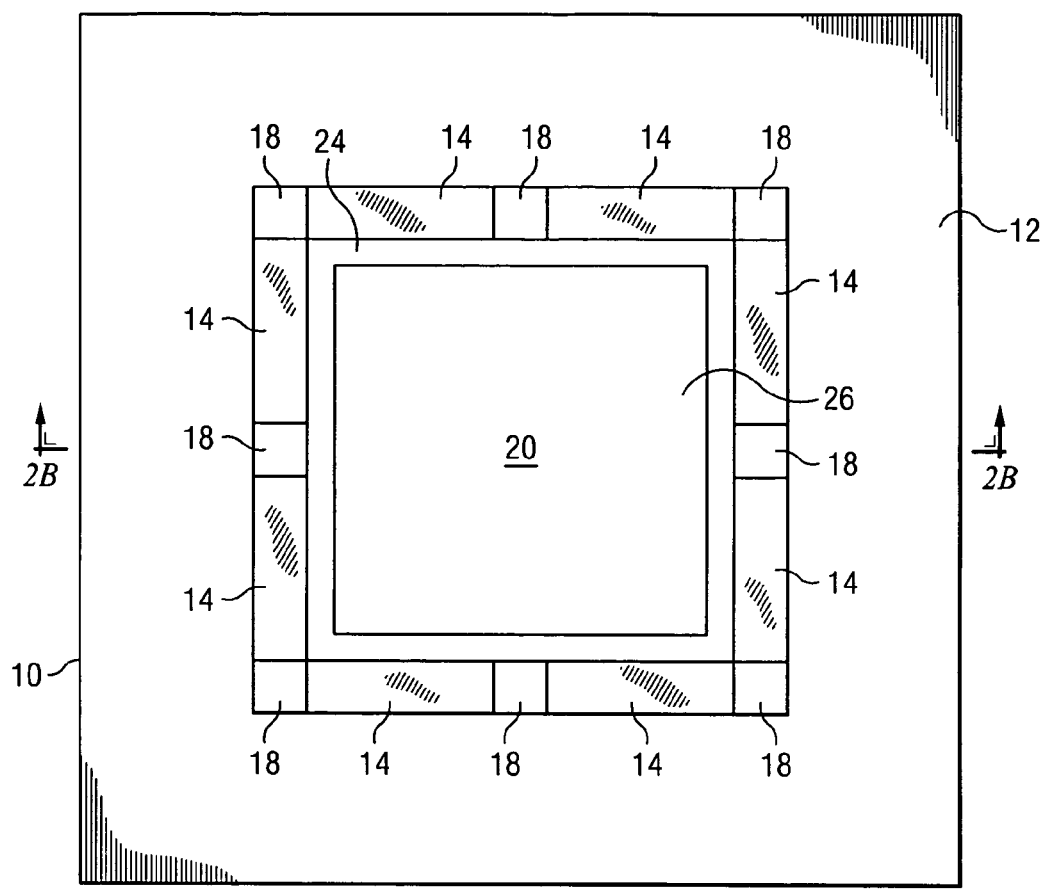
FIG. 2A is a top view showing a further step in an example of a method of manufacturing a device according to a preferred embodiment of the invention.
Figure 2B:
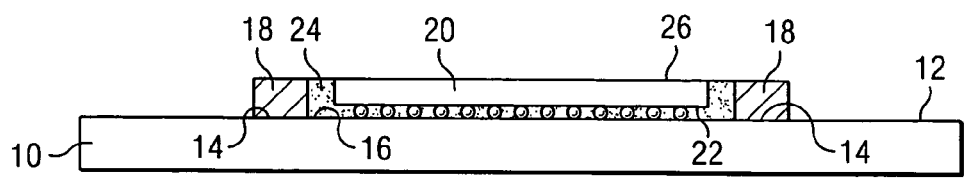
FIG. 2B is a cut-away side view corresponding to the top view of FIG. 2A, showing a step in the method of manufacturing a device according to a preferred embodiment of the invention.

Referring now to FIGS. 2A, and 2B, a top view and corresponding cut-away side view (taken along line 2B-2B of FIG. 2A), further steps in examples of the methods of the invention are shown. An IC, preferably a flip-chip IC 20, is affixed to the substrate 10 chip site 16 according to techniques known in the arts, frontside 22 down, completing corresponding electrical couplings between the chip 20 and substrate 10 as needed. Typically, underfill material 24 is injected between the substrate 10 and chip 20. The underfill material 24 is preferably a dielectric material and isolates the chip 20 from the surrounding substrate ground ring 14, and in this case, also from the vertical pillars 18. The underfill material 24 preferably also provides a mechanical bond between the chip 20 and substrate 10 and seals out environmental hazards. The underfilling process is preferably achieved by needle dispensation along the edges of the chip 20. Capillary action and/or an applied vacuum or blowing force draws the dispensed underfill 24 into position. Thermal curing is then performed to form a permanent bond. During fabrication, a dam or other blocking mechanism may be used to prevent underfill material 24 from obscuring the substrate ground ring 14 during dispensation and before curing.

Figure 3A:
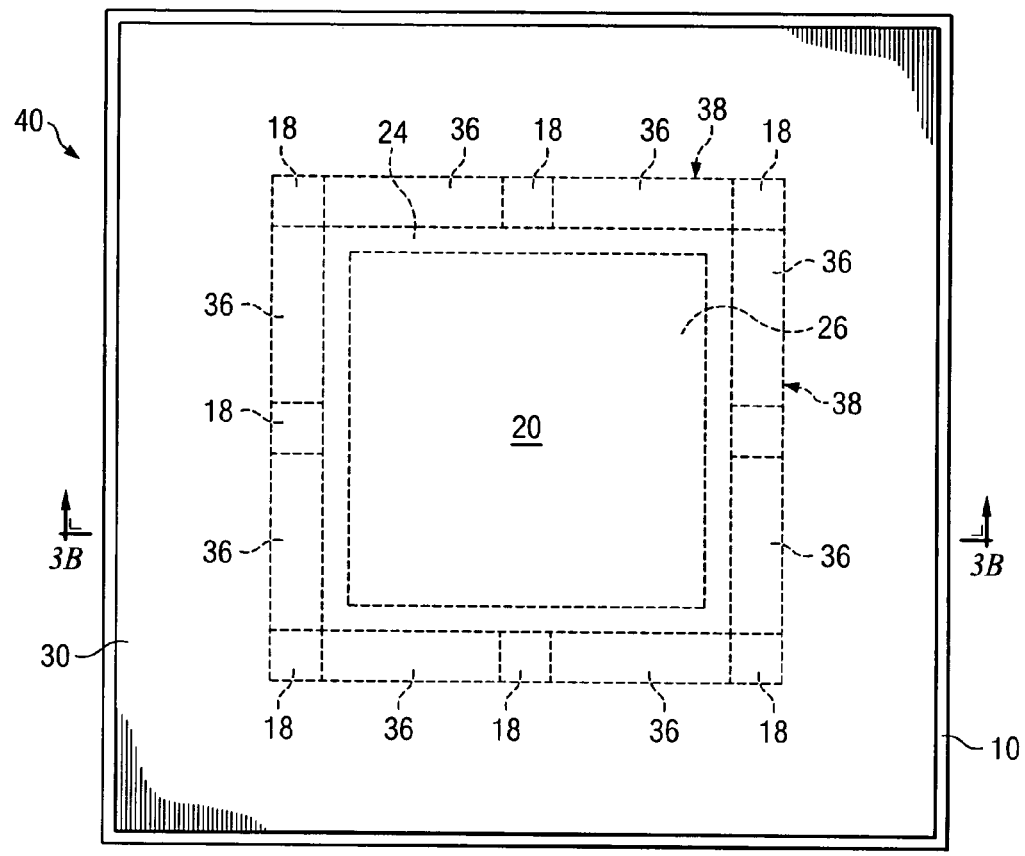
FIG. 3A is a top view showing another step in an example of a method of manufacturing a device according to a preferred embodiment of the invention.
Figure 3B:
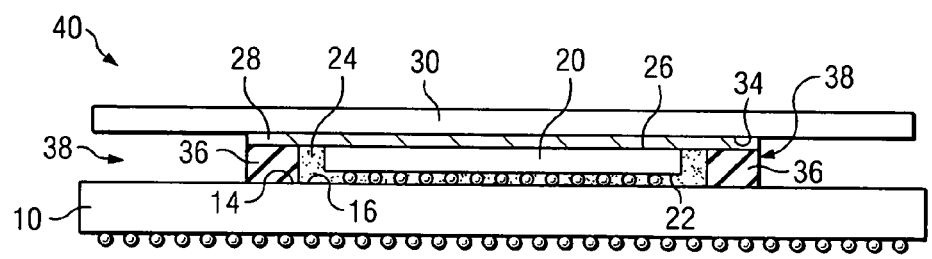
FIG. 3B is a cut-away side view corresponding to the top view of FIG. 3A, showing a step in the method of manufacturing a device according to a preferred embodiment of the invention.

As shown in the FIG. 3A top view, and FIG. 3B, a corresponding cut-away side view (taken along line 3B-3B of FIG. 3A), an adhesive material 28 such as conductive epoxy or solder is applied to the backside 26 of the chip 20. A heat spreader 30 is then affixed to the backside 26 of the chip 20. The heat spreader 30 is preferably attached using a suitable conductive adhesive material 28 such as conductive epoxy or solder in order to ensure electrical coupling between the backside 26 of the chip 20 and at least a ground ring portion 34 of the heat spreader 30. The heat spreader 30 is preferably made of metal, such as copper, or alloy, selected for both its electrical conductivity and thermal conductivity. The heat spreader 30 preferably extends past the periphery of the backside 26 of the chip 20 outward at least to a perimeter coincident with the outside edge of the substrate ground ring 14 below, and to the vertical pillars 18. The heat spreader 30 may have a continuous conductive surface for making contact with both the backside 26 of the chip and the vertical pillars 18. Preferably the heat spreader 30, which may have a partially insulated surface, has at least a conductive ground ring 34 approximately coinciding with the substrate ground ring 14. Note that line 3B-3B is offset to show conductive material 36, preferably interposed between the substrate ground ring 14 and the heat spreader ground ring 34, also engulfing the vertical pillars 18 as necessary. Thus, instead of an essentially two-dimensional "ground ring" on the substrate, a three-dimensional structure that may more accurately be termed a "ground annulus" 38 is formed, extending from the substrate ground ring 14 below to the similar heat spreader ground ring 34 above. The package 40 thus formed provides a ground ring structure 38 suitable for electrically coupling to the frontside 22 of the chip 20 and/or the backside 26 of the chip 20 as desired for a particular application and also improves thermal performance.

Figure 4:
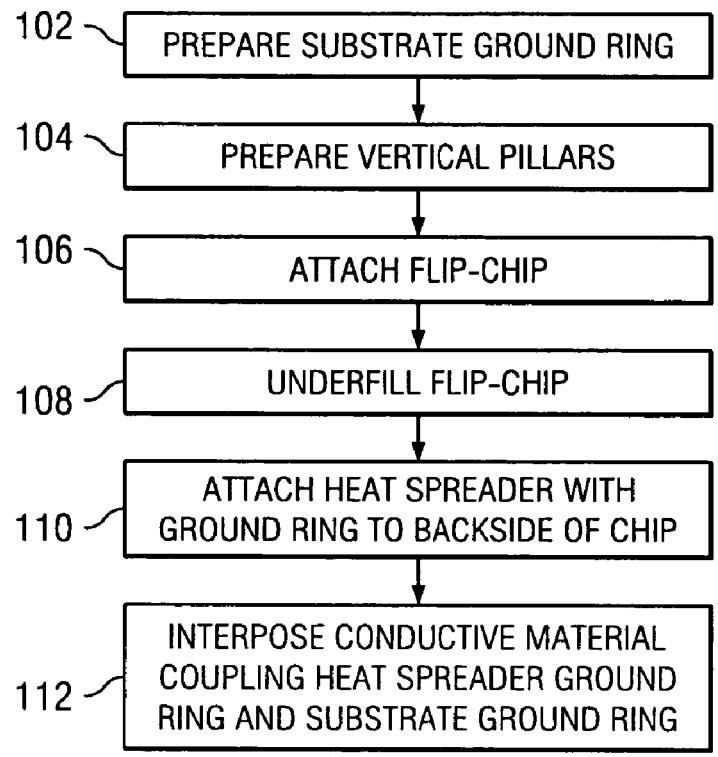
FIG. 4 is a process flow diagram showing steps in a preferred method of assembling a flip-chip BGA according to the invention.

FIG. 4 is a process flow diagram showing an alternative view of the steps in an example of a preferred method of assembling a BGA according to the invention. According to the process of the invention, a substrate is prepared with a chip site and encompassing ground ring, step 102. Vertical pillars are provided, 104, at the substrate ground ring. A chip, preferably a flip-chip, is attached to the substrate chip site as indicated at step 106. The chip is underfilled 108, preferably using techniques known in the arts for avoiding obscuration of the substrate ground ring. As shown at step 110, a heat spreader having a conductive surface including at least an exposed ground ring is attached to the backside of the chip, preferably using conductive adhesive such as epoxy. Conductive material is interposed between the substrate ground ring and heat spreader ground ring 112. Further steps, such as further singulating or packaging steps, may be performed without departure from the invention. It should also be understood by those of ordinary skill in the arts that the steps need not all be performed in the order shown and described and that additional steps may be added within the scope of the invention.

Figure 5:
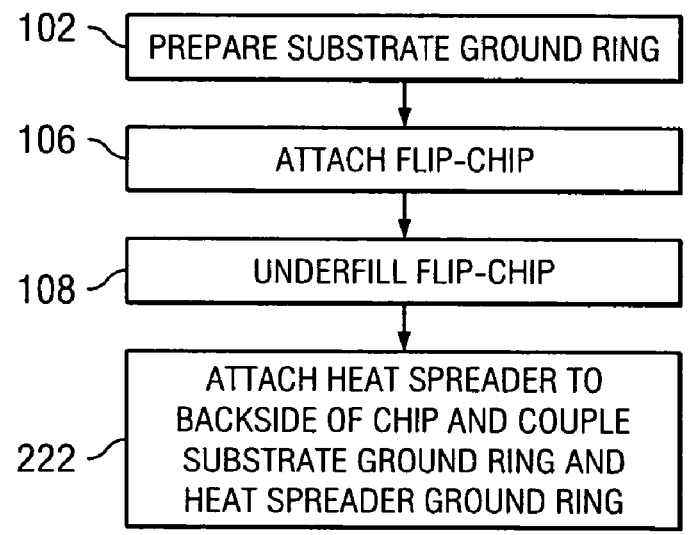
FIG. 5 is a process flow diagram showing steps in an example of an alternative embodiment of a method of assembling a flip-chip BGA according to the invention.

As an example of an alternative embodiment of the invention, the vertical pillars 18 shown and described may be omitted in some applications. Although the use of pillars 18 is presently preferred for facilitating the assembly process, the alternative embodiment is shown and described as an example of variations possible within the scope of the invention. Referring again primarily to FIGS. 3A and 3B, the conductive epoxy 28 used to attach the heat spreader 30 may in addition be spread over both the backside 26 of the chip 20 and the substrate GND ring 14. In this way, the substrate ground ring 14 and heat spreader ground rings 34 may be electrically connected in a single step, omitting the separate step of interposing conductive material 36 (FIG. 3B) there between. It is believed that in some instances, this variation may provide advantages. An additional view of this alternative embodiment is shown in the process flow diagram of FIG. 5, wherein a substrate is prepared with a chip site and encompassing ground ring, step 102. A chip, again preferably a flip-chip, is attached to the substrate chip site as indicated at step 106. The chip is underfilled 108, preferably as commonly performed the arts, and avoiding obscuration of the substrate ground ring. As shown at step 120, the heat spreader having at least an exposed conductive ground ring is attached to the backside of the chip, preferably using conductive adhesive such as epoxy, and the conductive adhesive extends between the substrate ground ring and the heat spreader ground ring. Further steps, such as additional encapsulation and singulation steps may be performed to complete the package.

The methods and apparatus of the invention provide one or more advantages including but not limited to improving backside grounding and heat dissipation in packaged semiconductor devices. While the invention has been described with reference to certain illustrative embodiments, those described herein are not intended to be construed in a limiting sense. For example, variations or combinations of steps in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A method of fabricating a BGA package comprising the steps of:
   providing a package substrate having a chip site for receiving a chip and a conductive ground ring surrounding an insulative gap encircling the chip site;
   operably connecting a frontside of a chip having a frontside and a backside to the substrate chip site;
   underfilling between the substrate chip site and the chip with dielectric material;
   providing a heat spreader having at least a conductive ground ring portion configured to coincide with the substrate conductive ground ring and configured for operably electrically coupling to the backside of the chip with an electrically conductive adhesive material;
   affixing the heat spreader to the backside of the chip; and
   interposing conductive material between the heat spreader conductive ground ring and the substrate conductive ground ring, thereby forming an electrically continuous annulus of conductive material from the substrate conductive ground ring to the heat spreader conductive ground ring.

2. A method according to claim 1 further comprising affixing a plurality of conductive vertical pillars to the substrate conductive ground ring and to the heat spreader conductive ground ring.

3. A method according to claim 1 further comprising filling between the chip and the electrically continuous annulus of conductive material with insulative material.

4. A method according to claim 1 wherein the chip further comprises a flip-chip.

5. A method according to claim 1 wherein the package substrate further comprises an insulated surface for receiving the chip.

6. A method of fabricating a BGA package comprising the steps of:
   providing a package substrate having a chip site for receiving a chip and a conductive ground ring surrounding an insulative gap encircling the chip site;
   operably connecting a frontside of a chip having a frontside and a backside to the substrate chip site;
   underfilling between the substrate chip site and the chip with dielectric material;
   affixing a plurality of conductive vertical pillars to the substrate coincident with the substrate conductive ground ring;
   providing a heat spreader having at least a conductive ground ring portion configured to coincide with the substrate conductive ground ring and configured for operably electrically coupling to the backside of the chip with an electrically conductive adhesive material;

affixing the heat spreader to the backside of the chip and to the plurality of conductive vertical pillars; and interposing conductive material between the heat spreader conductive ground ring and the substrate conductive ground ring, thereby forming an electrically continuous annulus of conductive material from the substrate conductive ground ring to the heat spreader conductive ground ring.

7. A method according to claim 6 further comprising filling between the chip and the electrically continuous annulus of conductive material with insulative material.

8. A method according to claim 6 wherein the chip further comprises a flip-chip.

9. A method according to claim 6 wherein the package substrate further comprises an insulated surface for receiving the chip.

\* \* \* \* \*